United States Patent
Liu

(10) Patent No.: US 11,882,689 B2
(45) Date of Patent: Jan. 23, 2024

(54) MEMORY AND MANUFACTURING METHOD THEREOF

(71) Applicant: CHANGXIN MEMORY TECHNOLOGIES, INC., Anhui (CN)

(72) Inventor: Chih-Cheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 61 days.

(21) Appl. No.: 17/460,436

(22) Filed: Aug. 30, 2021

(65) Prior Publication Data

US 2022/0045068 A1 Feb. 10, 2022

Related U.S. Application Data

(63) Continuation of application No. PCT/CN2021/103700, filed on Jun. 30, 2021.

(30) Foreign Application Priority Data

Aug. 6, 2020 (CN) .......................... 202010784622.3

(51) Int. Cl.
H01L 27/108 (2006.01)
H10B 12/00 (2023.01)
(Continued)

(52) U.S. Cl.
CPC ....... *H10B 12/36* (2023.02); *H01L 21/28088* (2013.01); *H01L 29/4966* (2013.01); *H10B 12/056* (2023.02)

(58) Field of Classification Search
CPC .... H10B 12/36; H10B 12/056; H10B 12/488; H10B 99/00; H10B 12/31;
(Continued)

(56) References Cited

U.S. PATENT DOCUMENTS 7,358,142 B2   4/2008 Kang
8,530,962 B2   9/2013 Jang
(Continued)

FOREIGN PATENT DOCUMENTS

CN   103165613 A   6/2013
CN   109427789 A   3/2019
(Continued)

OTHER PUBLICATIONS

First Office Action of the Japanese application No. 2022-556269, dated Nov. 14, 2023. 8 pages with English translation.

*Primary Examiner* — Mohammed R Alam

(74) *Attorney, Agent, or Firm* — Cooper Legal Group, LLC

(57) ABSTRACT

The embodiments of the present disclosure provide a memory and a manufacturing method of a memory. The memory includes first fins and second fins disposed on a substrate, a dielectric layer covering tops of the first fins and side wall surfaces exposed by an isolating structure, and work function layers disposed on a surface of the dielectric layer. In a direction parallel to an arrangement direction of the first fins and the second fins, the work function layers on the side walls where the adjacent first fins are opposite are provided with a first thickness, and the work function layers on the side walls where the first fins face towards the second fins are provided with a second thickness. The first thickness is greater than the second thickness.

20 Claims, 11 Drawing Sheets

(51) Int. Cl.
*H01L 21/28* (2006.01)
*H01L 29/49* (2006.01)

(58) Field of Classification Search
CPC .......... H01L 21/28088; H01L 29/4966; H01L 21/28; H01L 27/105; H01L 29/423; H01L 29/7854; H01L 21/28008; H01L 29/42356; H01L 29/42372; H01L 29/42364
See application file for complete search history.

(56) References Cited

U.S. PATENT DOCUMENTS

| | | |
|---|---|---|
| 2005/0170593 A1 | 8/2005 | Kang |
| 2011/0260242 A1 | 10/2011 | Jang |
| 2013/0277720 A1* | 10/2013 | Kim ................... H01L 29/785 257/288 |
| 2015/0263113 A1* | 9/2015 | Kim ................... H10B 12/053 257/296 |
| 2019/0067278 A1 | 2/2019 | Seo |

FOREIGN PATENT DOCUMENTS

| | | |
|---|---|---|
| CN | 210296374 U | 4/2020 |
| CN | 111200019 A | 5/2020 |
| WO | 2019091493 A1 | 5/2019 |

\* cited by examiner

MEMORY AND MANUFACTURING METHOD THEREOF

CROSS-REFERENCE TO RELATED APPLICATIONS

This application is a continuation of International patent application No. PCT/CN2021/103700, filed on Jun. 30, 2021, which is filed based upon and claims priority to Chinese patent application No. 202010784622.3, filed on Aug. 6, 2020. The contents of International patent application No. PCT/CN2021/103700 and Chinese patent application No. 202010784622.3 are incorporated herein by reference in their entireties.

TECHNICAL FIELD

The embodiments of the present disclosure relate to a memory and a manufacturing method thereof.

BACKGROUND

The memory is a memory part that is used for storing program and various data information. The memory may be a read only memory (ROM) and a random access memory (RAM) in terms of a usage type. A memory includes a plurality of memory cells. The memory cells may be used to store binary codes which are converted from storage information. The memory generally includes a capacitor and a transistor connected to the capacitor. The capacitor is configured to store charge representing the storage information, and the transistor is a switch that controls charge inflow and release of the capacitor. A source electrode, a drain electrode and a gate electrode are formed in the transistor, and the gate electrode is connected/coupled to a word line.

SUMMARY

An embodiment of the present disclosure provides a memory, which includes: a substrate, on which first fins and second fins are separately disposed, where at least two first fins are disposed between adjacent second fins, a spacing between the adjacent first fins is smaller than a spacing between the first fin and the second fin; a surface of the substrate is provided with an isolating structure including a first isolating structure and a second isolating structure, the first isolating structure is disposed between the adjacent first fins, and the second isolating structure is disposed between the first fin and the second fin; a dielectric layer covers tops of the first fins, side wall surfaces exposed by the isolating structure of the first fins, tops of the second fins and side wall surfaces exposed by the isolating structure of the second fins; work function layers disposed on a surface of the dielectric layer, where the work function layers on the side walls where the at least two first fins are opposite are provided with a first thickness, the work function layers on the side walls where the first fins face towards the second fins are provided with a second thickness in a direction parallel to an arrangement direction of the first fins and the second fins, and the first thickness is greater than the second thickness; and a conductive layer disposed on surfaces of the work function layers.

An embodiment of the present disclosure further provides a manufacturing method of a memory, which includes: providing a substrate, on which first fins and second fins are separately disposed, where at least two first fins are disposed between adjacent second fins, a spacing between the adjacent first fins is smaller than a spacing between the first fin and the second fin; a surface of the substrate is provided with an isolating structure including a first isolating structure and a second isolating structure, the first isolating structure is disposed between the adjacent first fins, and the second isolating structure is disposed between the first fin and the second fin; forming a dielectric layer on tops of the first fins, side wall surfaces exposed by the isolating structure of the first fins, tops of the second fins and side wall surfaces exposed by the isolating structure of the second fins; forming work function layers on a surface of the dielectric layer, where the work function layers on the side walls where the at least two first fins are opposite are provided with a first thickness, the work function layers on the side walls where the first fins face towards the second fins are provided with a second thickness in a direction parallel to an arrangement direction of the first fins and the second fins, and the first thickness is greater than the second thickness; and forming a conductive layer on surfaces of the work function layers, where a work function value of the conductive layer is smaller than work function values of the work function layers.

BRIEF DESCRIPTION OF THE DRAWINGS

Exemplary description of one or more embodiments is made through pictures in the corresponding drawings thereof, which not intended to limit the embodiments. Unless specifically stated otherwise, the pictures in the drawings is not limited in proportion.

DETAILED DESCRIPTION

It may be known from the above background art that the memory has the problem of instability.

Through analysis, the major cause of the problems is that electronic signal interference between adjacent storage capacitors is more and more serious since process nodes of the memory are reduced continuously and the dimension of a shallow trench isolating structure in an active region is continuously reduced.

Figure 1:
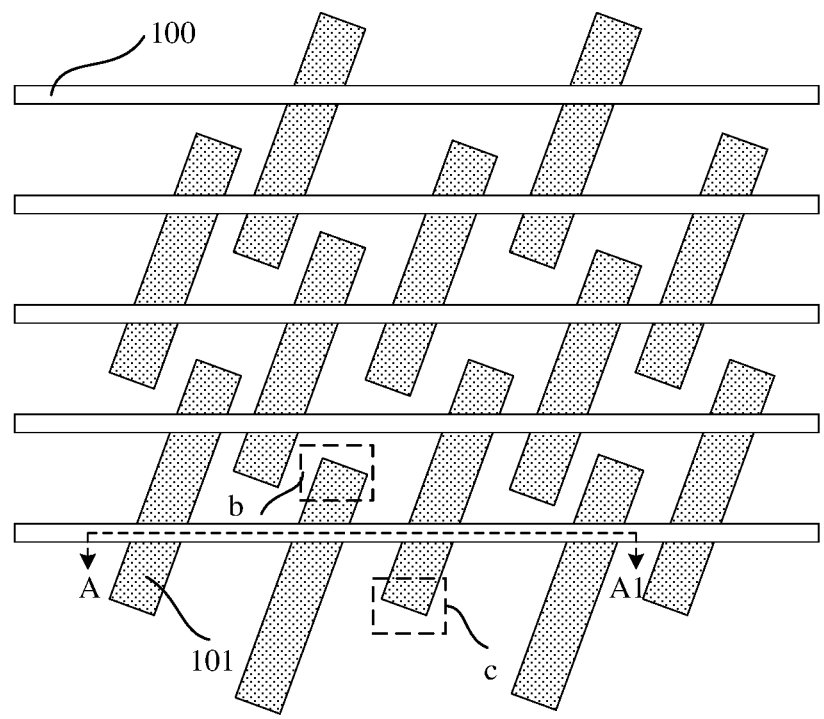
FIG. 1 is a top view of a memory.
Figure 2:
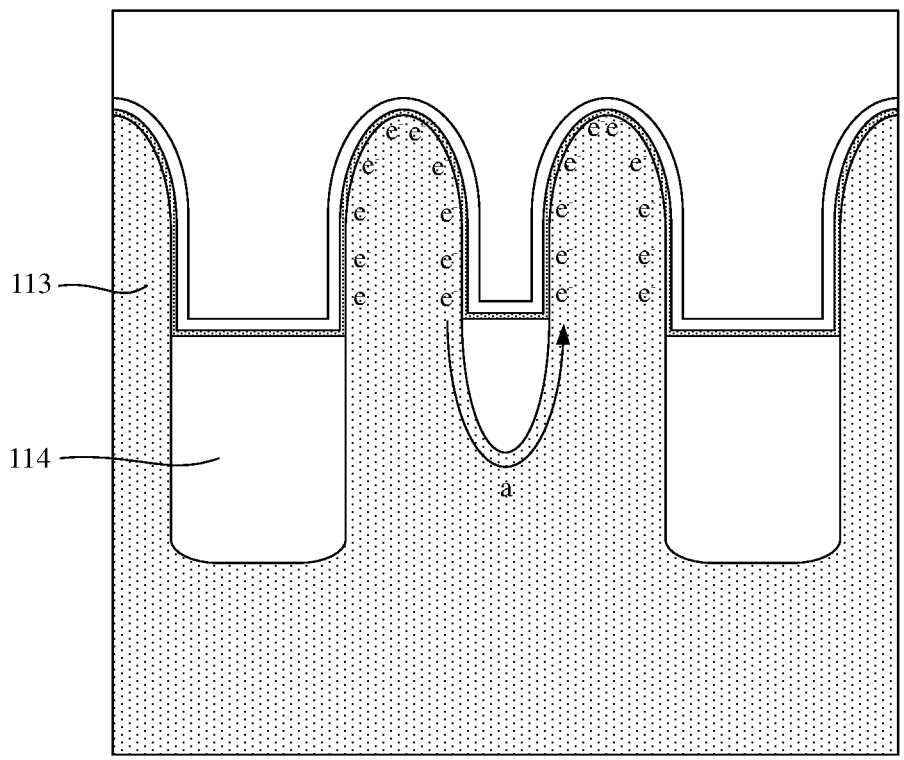
FIG. 2 is a schematic sectional view of a memory along a A-A1 line in FIG. 1.

FIG. 1 is a top view of a memory. FIG. 2 is a schematic sectional view of a memory along a A-A1 line in FIG. 1, and the A-A1 line direction is an extending direction of a word line.

At present, FIG. 1 is combined with FIG. 2 for analysis. FIG. 1 shows a plurality of active regions 101, FIG. 2 shows four fins 113 and isolating structures 114 disposed between the adjacent fins 113, and the four fins in FIG. 2 correspond to sections of the four active regions 101 along the A-A1 line in FIG. 1. The depth of the isolating structure between the active regions 101 with a smaller spacing there-between is smaller due to etching and loading effect, that is, the depth of the isolating structure 114 between the two fins 113 is smaller. When a word line 100 reads, electrons e⁻ are generated in the channel region in the fins 113. For the two middle fins 113, since the two middle fins 113 are close together, and the width and depth of the isolation structure 114 between the two fins 113 are relatively small, and therefore, a first diffusion path a for diffusing the electrons e⁻ from one fin 113 to the other fin 113 is shorter. The electrons e⁻ easily pass through from the below of the isolating structure 114, so that signal interference between adjacent fins 113, that is signal interference between two adjacent storage capacitors b and c, is caused, and maintenance time of the electrons in the storage capacitors is affected.

According to further analysis, for the two middle fins 113, the two fins 113 include opposite first areas and second areas facing the fins 113 at the two ends, and the electrons e⁻ capable of being diffused in the first areas are almost as many as those capable of being diffused in the second area. If the electrons e⁻ capable of being diffused in channel regions of the first areas may be reduced, the mutual diffusion problem of the electrons e⁻ of the two fins 113 in the middle can be improved.

To solve the problem, the embodiments of present disclosure provide a memory and a manufacturing method thereof. Threshold voltage in an area where the two first fins are opposite and an area where the first fin is opposite to the adjacent second fin is adjusted by adjusting thicknesses of work function layers. The thickness of the work function layers on the side walls where the adjacent first fins are opposite is greater than the thickness of the work function layers on the side walls where the first fins face towards the second fins, so that the threshold voltage in the area where the adjacent first fins are opposite is greater than the threshold voltage in the area where the first fin faces towards the (adjacent) second fin. Therefore, in a reading process of the word line 100, the threshold voltage in the area where the adjacent first fins are opposite is greater, so that fewer electrons are gathered in a channel region thereof, that is, fewer electrons may be diffused. As a result, fewer electrons are diffused between two first fins, signal interference is small, and stability of the memory is good.

In order to make the purpose, technical scheme and advantages of the embodiments of the present disclosure clearer and more obvious, the embodiments of the present disclosure will be further illustrated in detail in combination with accompanying drawings hereinafter. However, those ordinary skilled in the art can understand that numerous technical details are provided in the embodiments of the present disclosure to give the reader a fuller understanding of the present disclosure. The claimed technical schemes of the present disclosure also may be realized without the technical details and various changes and modifications based on the following embodiments.

Figure 3:
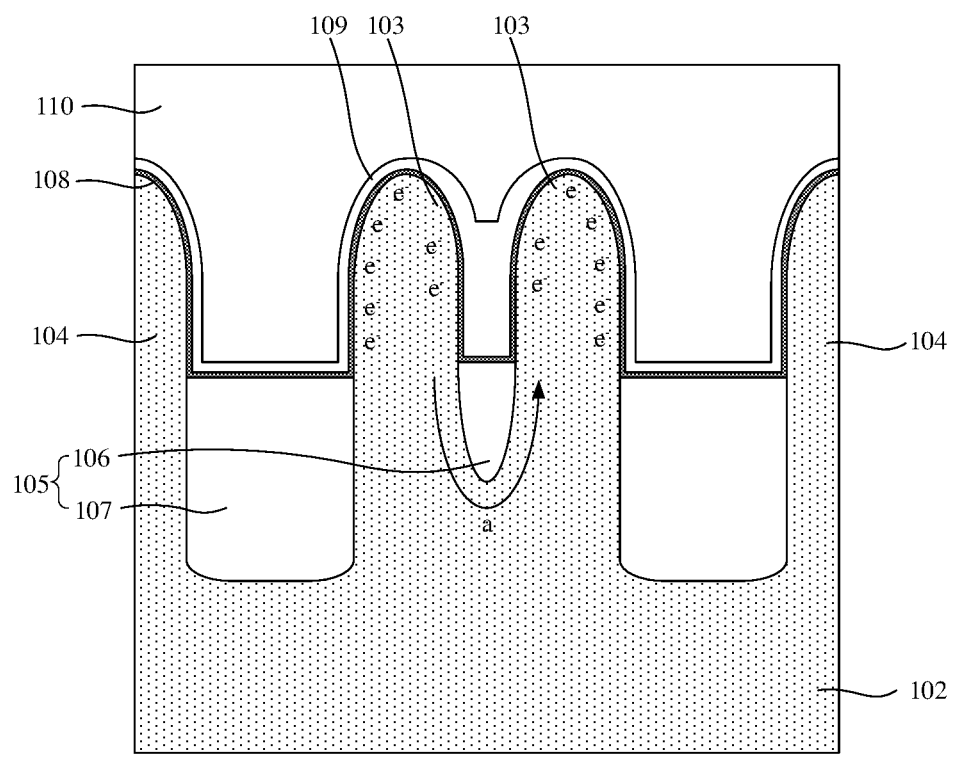
FIG. 3 is a first schematic sectional view of a memory along a A-A1 line in FIG. 1 provided in a first embodiment of the present disclosure.
Figure 4:
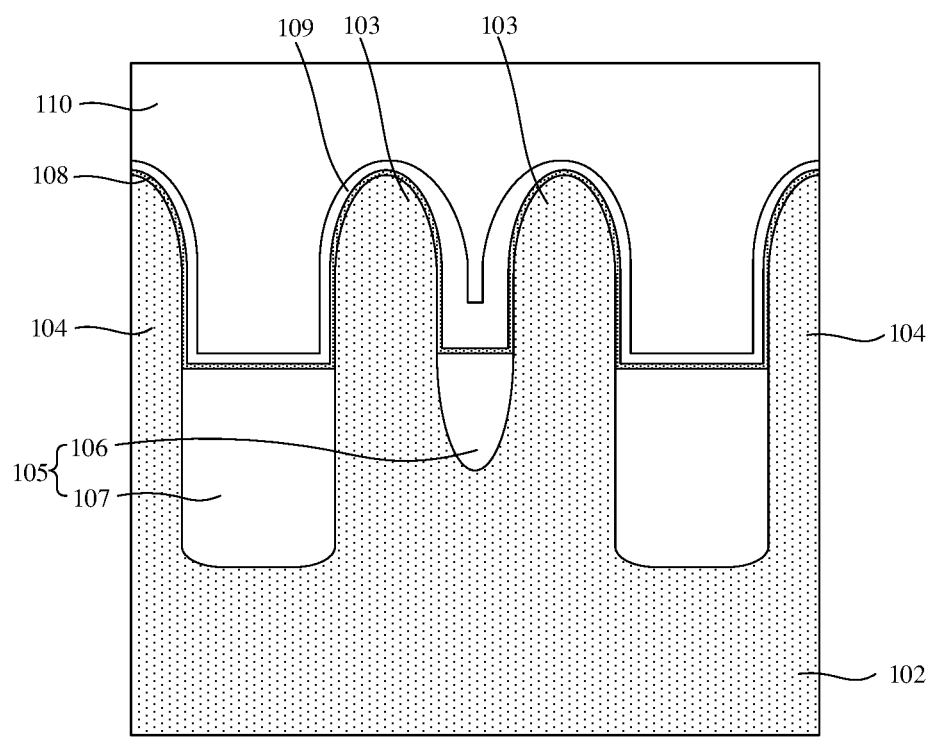
FIG. 4 is a second schematic sectional view of a memory along a A-A1 line in FIG. 1 provided in a first embodiment of the present disclosure.

A first embodiment of the present disclosure provides a memory, FIG. 3 and FIG. 4 are structural schematic diagrams of a memory provided in the first embodiment of the present disclosure. FIG. 3 is a first schematic sectional view of a memory along a A-A1 line in FIG. 1, and FIG. 4 is a second schematic sectional view of a memory along a A-A1 line in FIG. 1.

Referring to FIG. 3 and FIG. 4, in the embodiments, the memory includes: a substrate 102, first fins 103 and second fins 104 separately disposed on the substrate 102, a dielectric layer 108, work function layers 109, and a conductive layer 110. At least two first fins 103 are disposed between the adjacent second fins 104, and a spacing between the adjacent first fins 103 is smaller than a spacing between the first fin 103 and the second fin 104. A surface of the substrate 102 is provided with an isolating structure 105, which includes a first isolating structure 106 and a second isolating structure 107, the first isolating structure 106 is disposed between the adjacent first fins 103, and the second isolating structure 107 is disposed between the first fins 103 and the second fins 104. The dielectric layer 108 covers tops of the first fins 103, side wall surfaces exposed by the isolating structure 105, tops of the second fins 104 and side wall surfaces exposed by the isolating structure 105. The work function layers 109 are disposed on a surface of the dielectric layer 108, the work function layers 109 on walls where the at least two first fins 103 are opposite are provided with a first thickness, and the work function layers 109 on side walls where the first fins 103 face towards the second fins 104 are provided with a second thickness in a direction parallel to an arrangement direction of the first fins 103 and the second fins 104. The first thickness is greater than the second thickness. The conductive layer 110 is disposed on surfaces of the work function layers 109.

The memory provided in the embodiments will be described in detail in conjunction with the accompanying figures hereafter.

In the embodiments, the arrangement direction of the first fins 103 and the second fins 104 is identical with an extending direction of a word line 100 (referring to FIG. 1), that is, the arrangement direction is identical with the A-A1 line direction.

The materials of the substrate 102 include silicon, germanium or other semiconductor materials.

In the embodiments, the materials of the first fins 103 and the second fins 104 are identical with the material of the substrate 102. In other embodiments, the materials of the first fins and the second fins may be different from the materials of the substrate.

The materials of the isolating structure 105 include silicon dioxide, silicon nitride, silicon carbide or other insulating materials. The first isolating structure 106 may block electron transport between the adjacent first fins 103, and the second isolating structure 107 may block the electron transport between the first fins 103 and the adjacent second fins 104.

In the extending direction of the word line 100 (referring to FIG. 1), the width of the first isolating structure 106 is smaller than that of the second isolating structure 107. In a direction perpendicular to the extending direction of the word line 100 (referring to FIG. 1), the depth of the first isolating structure 106 is smaller than that of the second isolating structure 107.

In the embodiments, an upper surface of the first isolating structure 106 is higher than that of the second isolating structure 107. In other embodiments, the upper surface of the first isolating structure may be flush with that of the second isolating structure.

The dielectric layer 108 is taken as a gate dielectric layer of the memory. The dielectric layer 108 further covers the upper surface of the isolating structure 105. In other embodiments, the dielectric layer may not cover the upper surface of the isolating structure.

The materials of the dielectric layer 108 include silicon dioxide or other high-dielectric-constant materials.

Threshold voltage in an area where the adjacent first fins 103 are opposite may be adjusted by adjusting the thickness of the work function layer 109 between the adjacent first fins 103, so that quantity of electrons capable of being diffused in a channel region between the adjacent first fins 103 is adjusted. In the embodiments, the thickness of the work function layers 109 on the side walls where the adjacent first fins 103 are opposite is greater than the thickness of the work function layers 109 on the side walls where the first fins 103 face towards the second fins 104, so that the threshold voltage in the area where the adjacent first fins 103 are opposite is greater than the threshold voltage in the areas where the first fins 103 face towards the second fins 104. In case of keeping applied working voltage unchanged, the threshold voltage is increased, electrons capable of transferring under the working voltage are reduced, and fewer electrons are gathered in the channel region, so that electron transfer between the first fins 103 can be reduced, and the mutual interference problem of memory cells is reduced.

The work function layers 109 on the side walls where the at least two first fins 103 are opposite are provided with a first thickness, and the work function layers 109 on the side walls where the first fins 103 face towards the second fins 104 are provided with a second thickness in a direction parallel to an arrangement direction of the first fins 103 and the second fins 104. The first thickness is greater than the second thickness, and thickness difference may be in a range of around 3 nm to around 30 nm, also may be around 5 nm to around 20 nm or around 8 nm to around 15 nm. The thickness difference is kept within a larger range, so that difference between the threshold voltage in the area where the adjacent first fins 103 are opposite and the threshold voltage in the area where the first fin 103 faces towards the second fin 104 is kept within a larger range. In such a manner, electrons capable of diffusing in the channel region between the first fins 103 are fewer, and signal interference is smaller.

The first thickness may be in a range of around 5 nm to around 50 nm, for example around 10 nm, 20 nm or 40 nm. The second thickness may be in a range of around 2 nm to around 30 nm, for example around 2 nm, 5 nm or 15 nm.

Referring to FIG. 3, in a direction where the substrate 102 points to the first fins 103, the dielectric layer 108 and the first isolating structure 106 are enclosed into a first filling region in the area where the adjacent first fins 103 are opposite. In the embodiment, since the dielectric layer 108 further covers the upper surface of the first isolating structure 106, the dielectric layer 108 is enclosed into the first filling region which is filled up with the work function layers 109. The first filling region is in a range of around 8 nm to around 50 nm in width, further may be around 10 nm to around 40 nm or around 12 nm to around 30 nm.

Compared with a mode of only covering the side walls of the first fins 103, the first filling region are filled up with the work function layers 109. In such a manner, the threshold voltage in the area where the adjacent first fins 103 are opposite is further favorably increased, so that the electrons capable of being diffused in the channel region between the adjacent first fins 103 are reduced, and signal interference of the storage units is reduced.

In other embodiments, referring to FIG. 4, a gap is formed between the work function layers 109 on the side walls where the adjacent first fins 103 are opposite.

The materials of the work function layers 109 include titanium nitride, cobalt or nickel with higher work functions. Each work function layer 109 may be made of single material or a plurality of materials. In the embodiment, the materials of the work function layers 109 may be titanium nitride.

The work functions of the work function layers 109 are greater than that of the conductive layer 110. The conductive layer 110 is taken as a word line, and the materials of the conductive layer include tungsten or other conductive materials.

In summary, the thickness of the work function layers 109 on the side walls where the adjacent first fins 103 are opposite is greater than the thickness of the work function layers 109 on the side walls where the first fins 103 face towards the adjacent second fins 104, so that the threshold voltage in the area where the adjacent first fins 103 are opposite is greater than the threshold voltage in the area where the first fin 103 faces towards the second fin 104. In such a manner, the electrons capable of transferring and gathering in the channel region under the same working voltage are favorably reduced, so that the electrons that are transferred through the channel region are reduced. In such a manner, signal interference between the adjacent first fins 103 is reduced, and stability of the memory is improved.

Figure 5:
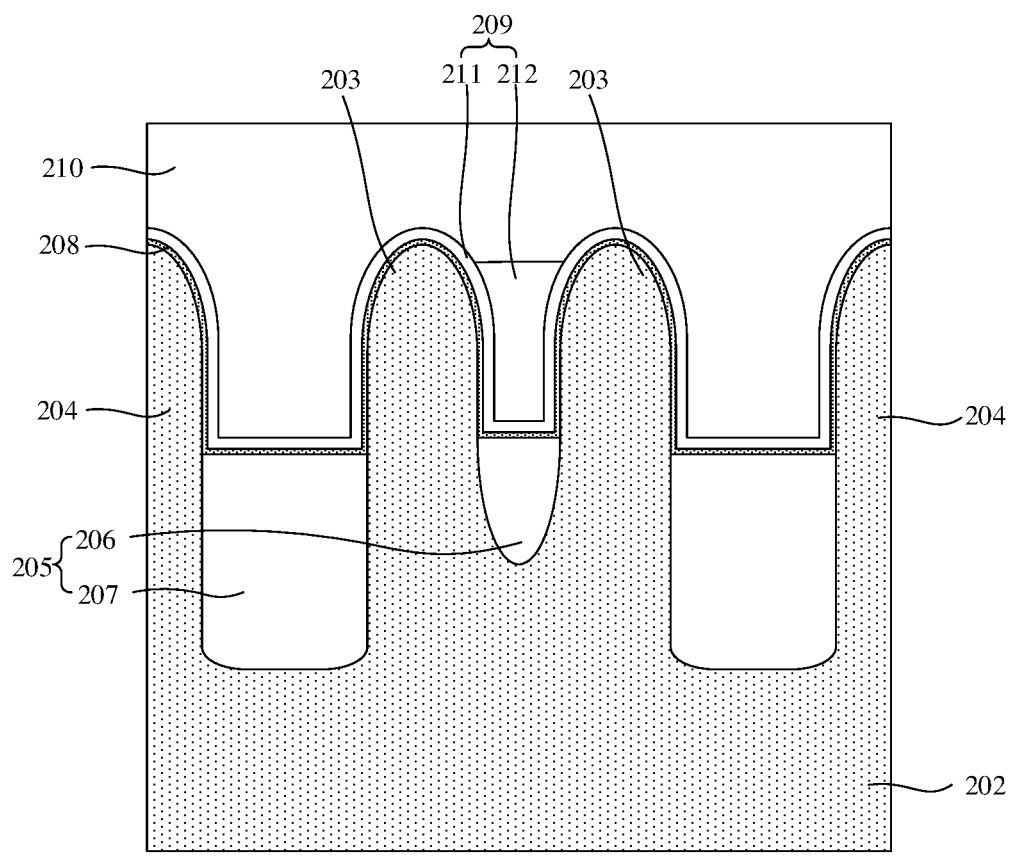
FIG. 5 is a schematic sectional view of a memory provided in a second embodiment of the present disclosure.

A second embodiment of the present disclosure provides a memory which is substantially identical with the memory in the above-mentioned embodiment, and the main difference is that the work function layers include a first work function layer and a second work function layer. The memory provided in the second embodiment of the present disclosure will be described in detail below in combination the accompanying drawings. It should be noted that the portions corresponding to or identical with the embodiments are all the same as the previous embodiments, and herein are not described repeatedly. FIG. 5 is a schematic sectional view of a memory provided in a second embodiment of the present disclosure.

Referring to FIG. 5, the memory includes: a substrate 202, first fins 203 and second fins 204 separately disposed on the substrate 202, an isolating structure 205 disposed on a surface of the substrate 202, a dielectric layer 208, work function layers 209 and a conductive layer 210. The isolating structure 205 includes a first isolating structure 206 and a second isolating structure 207, the first isolating structure 206 is disposed between the adjacent first fins 203, and the second isolating structure 207 is disposed between the first fins 203 and the second fins 204. The dielectric layer 208 covers tops of the first fins 203, side wall surfaces exposed by the isolating structure 205, tops of the second fins 204 and side wall surfaces exposed by the isolating structure 205. The work function layers 209 are disposed on a surface of the dielectric layer 208. The conductive layer 210 is disposed on surfaces of the work function layers 209.

In the embodiment, the work function layers 209 include a first work function layer 211 and a second work function layer 212, the first work function layer 211 covers the whole surface of the dielectric layer 208, and the second work function layer 212 is disposed on the first work function layer 211 on the side walls where the at least two first fins 203 are opposite.

The thickness of the work function layers 209 on the side walls where the adjacent first fins 203 are opposite is equal to the thickness sum of the first work function layer 211 and the second work function layer 212. The thickness sum is greater than the thickness of the work function layers 209 on the side walls where the first fins 203 are opposite to the second fins 204, so that the threshold voltage in an area where the adjacent first fins 203 are opposite is greater than the threshold voltage in an area where the first fin 203 faces towards the second fin 204. As a result, fewer electrons are diffused in a channel region between the adjacent first fins 203, signal interference between the two first fins 203 is small, and stability of the memory is good.

In the embodiment, the area where the two first fins 203 are opposite is filled up with the second work function layer 212, i.e., the second work function layer 212 is of an integrated structure, instead of two separated work function layers covering the different first fins 203, there being no gap in the second work function layer 212. In addition, filling the area where the two first fins 203 are opposite further means that the thickness of the second work function layer 212 in a direction perpendicular to the surface of the substrate 202 is greater than preset requirements, for example, height difference between a top surface of the second work function layer 212 and top surfaces of the first fins 203 is smaller than preset height difference. In other embodiments, the area where the two first fins 203 are opposite may not be filled up with the second work function layer 212.

In the embodiment, the materials of the first work function layer 211 are identical with those of the second work function layer 212. Binding force between interfaces may be increased if the materials are the same, so that resistance is reduced. In other embodiments, the materials of the first work function layer may be different from those of the second work function layer.

In summary, the thickness of the work function layer 209 between the two adjacent first fins 203 is the total thickness of the first work function layer 211 and the second work function layer 212. The threshold voltage in the area between the adjacent first fins 203 is increased with increase in the thickness. The electrons capable of diffusing in the channel region between the adjacent first fins 203 are fewer, so that signal interference is smaller.

A third embodiment of the present disclosure provides a manufacturing method of a memory, the method is used for manufacturing the memory provided in the first embodiment. FIG. 6 to FIG. 9 are structural schematic diagrams showing each step in the manufacturing method of the memory provided in the third embodiment of the present disclosure.

Figure 6:
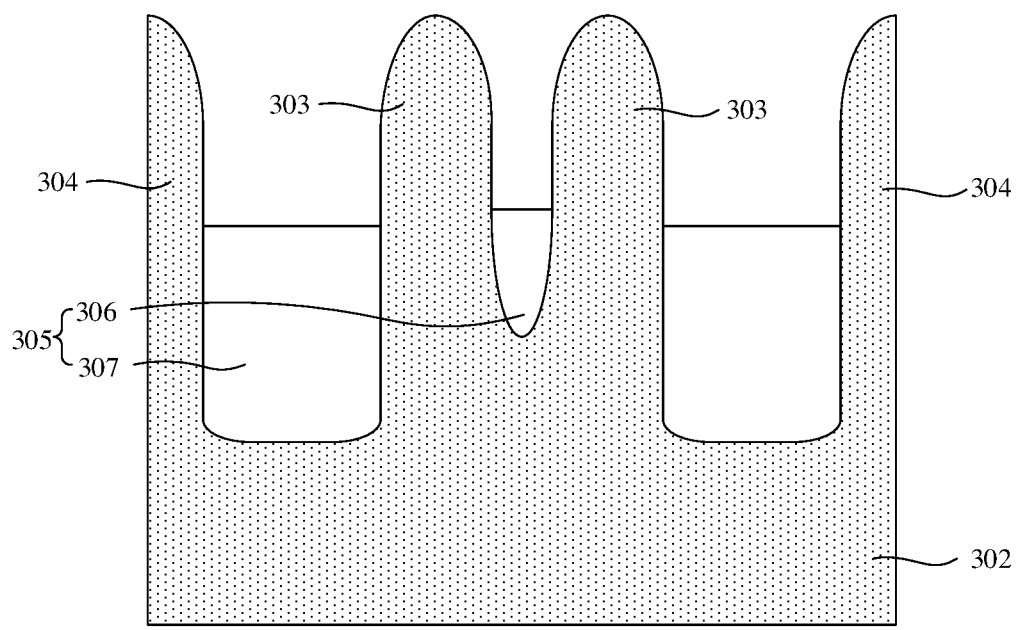
FIG. 6 to FIG. 9 are structural schematic diagrams showing each step in a manufacturing method of a memory provided in embodiments of the present disclosure.

Referring to FIG. 6, a substrate 302 is provided, first fins 303 and second fins 304 are separately disposed on the substrate 302, the at least two first fins 303 are disposed between the adjacent second fins 304, a spacing between the adjacent first fins 303 is smaller than a spacing between the first fin and the second fin 304, an isolating structure 305 is provided on a surface of the substrate 302, and the isolating structure 305 covers part of side walls of the first fins 303 and part of side walls of the second fins 304.

The width of a first isolating structure 306 is smaller than that of a second isolating structure 307. In addition, the greater the etched area, the greater the etched depth due to etching and loading effect, and therefore, the depth of the first isolating structure 306 is smaller than that of the second isolating structure 307.

Figure 7:
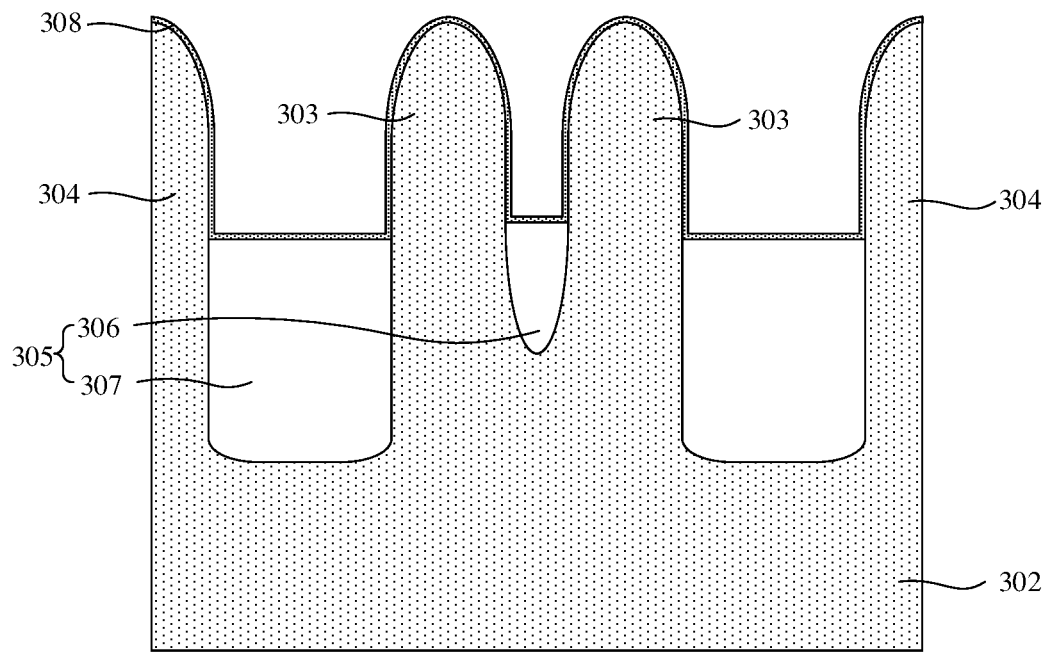

Referring to FIG. 7, a dielectric layer 308 is formed on tops of the first fins 303 and side wall surfaces exposed by the isolating structure 305, and the dielectric layer 308 covers tops of the second fins 304 and side wall surfaces exposed by the isolating structure 305.

In the embodiment, the dielectric layer 308 further covers an upper surface of the first isolating structure 306 and an upper surface of the second isolating structure 307. In other embodiments, the dielectric layer may also not cover the upper surfaces of the first isolating structure and the second isolating structure.

Figure 8:
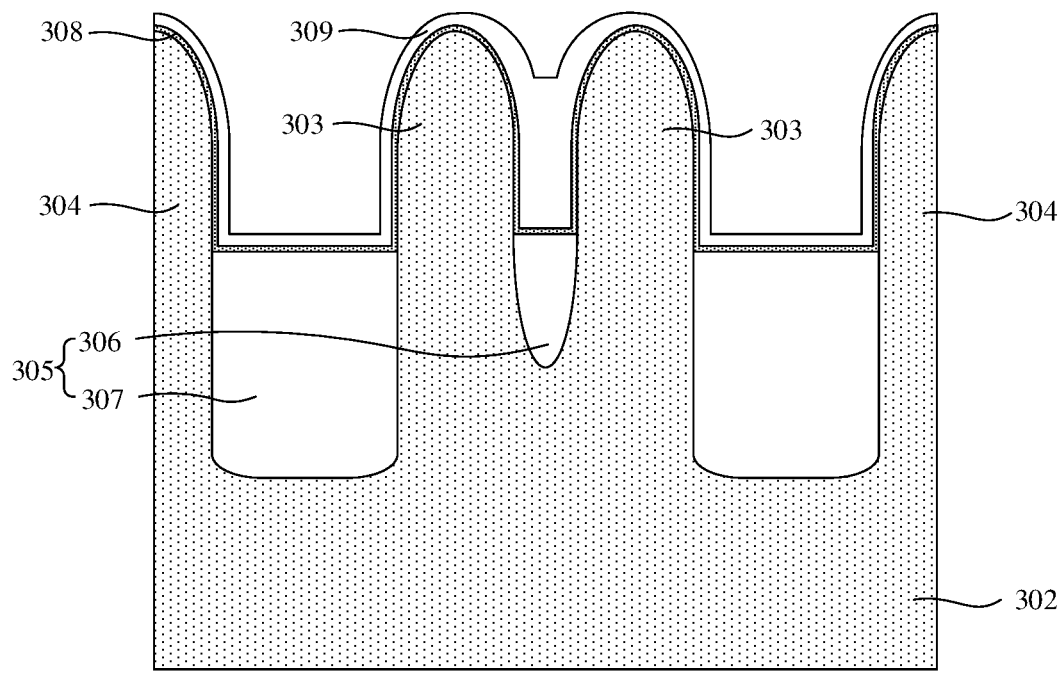

Referring to FIG. 8, work function layers 309 are formed on a surface of the dielectric layer 308, in a direction parallel to an arrangement direction of the first fins 303 and the second fins 304, the work function layers 309 on the side walls where the at least two first fins 303 are opposite are provided with a first thickness, and the work function layers 309 on the side walls where the first fins 303 face towards the second fins 304 are provided with a second thickness, and the first thickness is greater than the second thickness.

In a direction where the substrate 302 points to the first fins 303, the dielectric layer 308 and the first isolating structure 306 are enclosed into a first filling region in the area where the adjacent first fins 303 are opposite. In the embodiment, since the dielectric layer 308 further covers the upper surface of the first isolating structure 306, the dielectric layer 308 is enclosed into the first filling region. In the embodiment, the step of forming the work function layers 309 includes: the work function layers 309 are formed on the whole surface of the dielectric layer 308 until the first filling region is filled up. The deposition rate in a narrow channel region is higher than that in a wide channel region by adjusting the coverage of a deposition film, so that the work function layers 309 are formed through one process step, and the manufacturing difficulty may be reduced.

It should be noted that the spacing between the two first fins 303 may be reduced in order to increase filling speed of the work function layers 309 in the first filling region.

It should be noted that the work function layers may be accomplished through multiple steps. For example, the work function layers may be independently formed on the side walls where the adjacent first fins are opposite, or the work function layers may be formed on the side walls where the first fins are opposite to the second fins.

Figure 9:
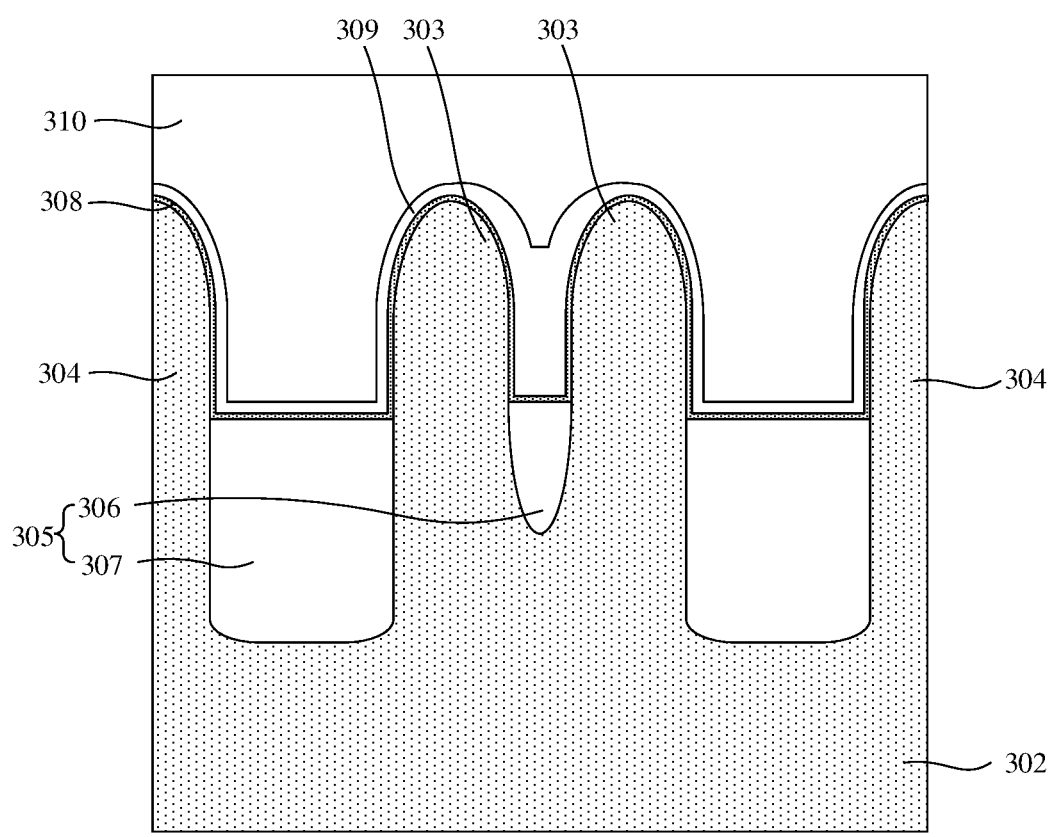

Referring to FIG. 9, a conductive layer 310 is formed on surfaces of the work function layers 309, and a work function value of the conductive layer 310 is smaller than work function values of the work function layers 309.

In summary, by adjusting the process step of manufacturing the work function layers 309, the thickness of the work function layers 309 on the side walls where the adjacent first fins 303 are opposite is greater than the thickness of the work function layers 309 on the side walls where the first fins 303 face towards the second fins 304, so that the threshold voltage in the area where the adjacent first fins 303 are opposite is greater than the threshold voltage in the area where the first fin 303 faces towards the second fin 304. As a result, fewer electrons are diffused in the channel region between the adjacent first fins 303, signal interference is small, and stability of the memory is good.

A fourth embodiment of the present disclosure provides a manufacturing method of a memory, and the method is used for manufacturing the memory provided in the second embodiment. Different from the third embodiment, in this embodiment, a first work function layer and a second work function layer are formed in an area where the two first fins are opposite. FIG. 10 to FIG. 15 are structural schematic diagrams showing each step in the manufacturing method of the memory provided in a third embodiment of the present disclosure. The portions corresponding to or identical with the third embodiment are all the same as the previous embodiment, and herein are not described repeatedly.

Figure 10:
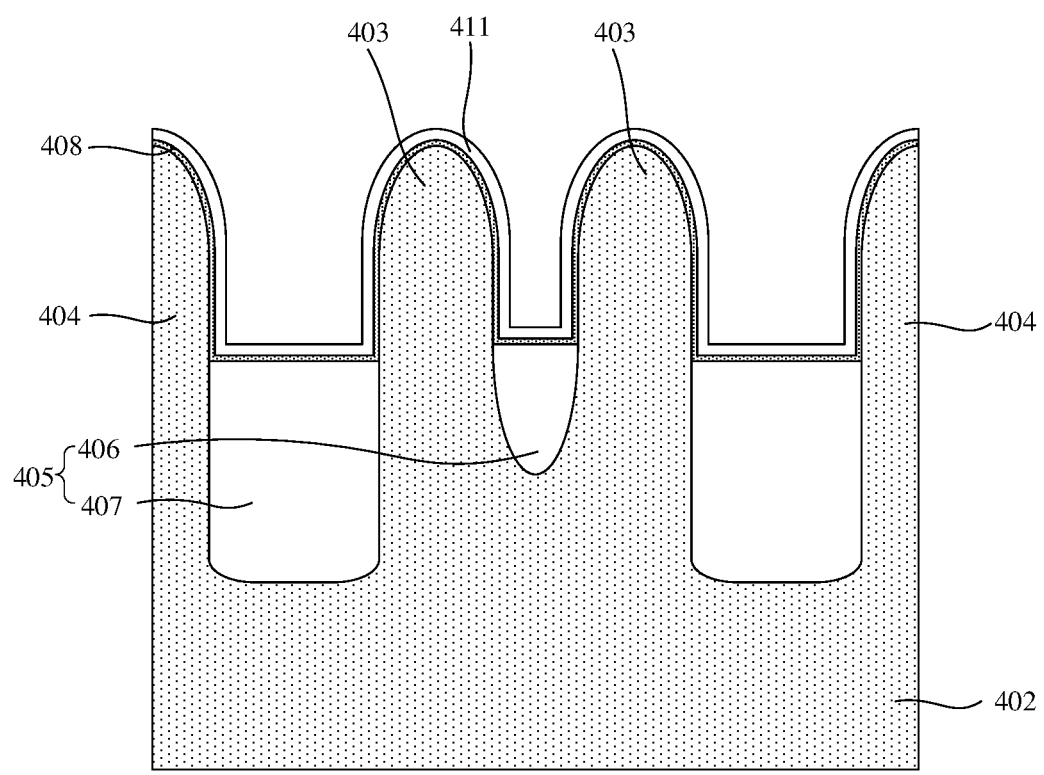
FIG. 10 to FIG. 15 are structural schematic diagrams showing each step in another manufacturing method of a memory provided in embodiments of the present disclosure.

Referring to FIG. 10, a first work function layer 411 is formed on a surface of a dielectric layer 408.

Please refer to the third embodiment for a detailed description related to a substrate 402, first fins 403 and second fins 404 on the substrate 402, an isolating structure 405, a first isolating structure 406 and a second isolating structure 407 provided in the embodiment. Please refer to the third embodiment for a forming method of the dielectric layer 408 provided in the embodiment, which is not described repeatedly herein.

Figure 11:
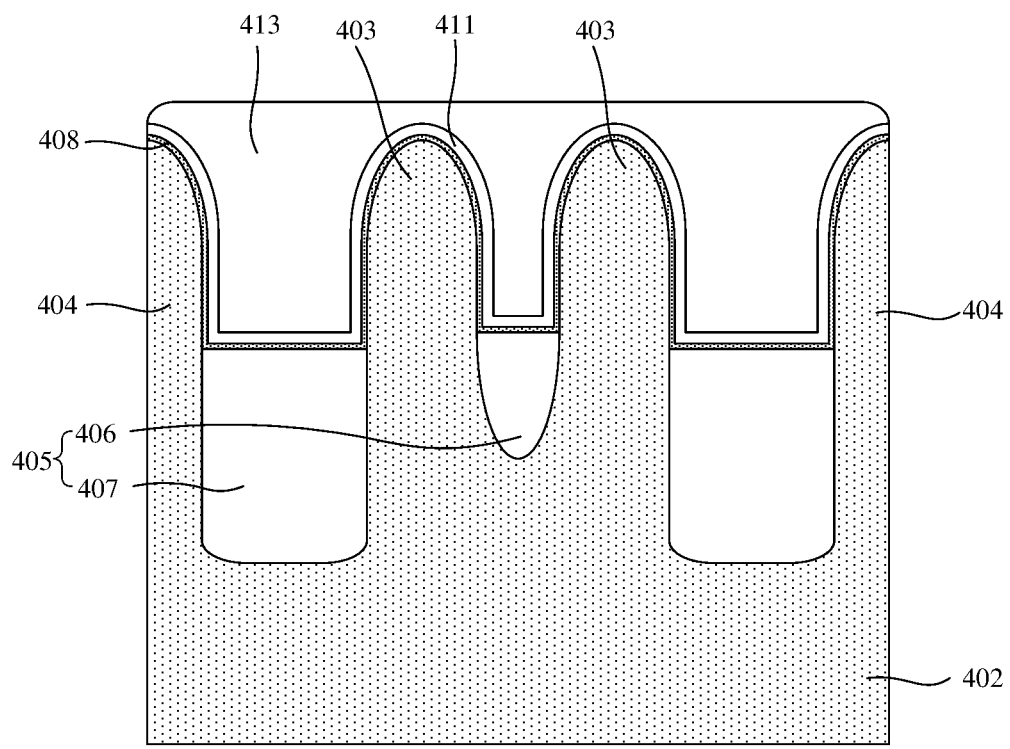

Referring to FIG. 11, a sacrificial layer 413 is formed on a surface of the first work function layer 411.

Figure 12:
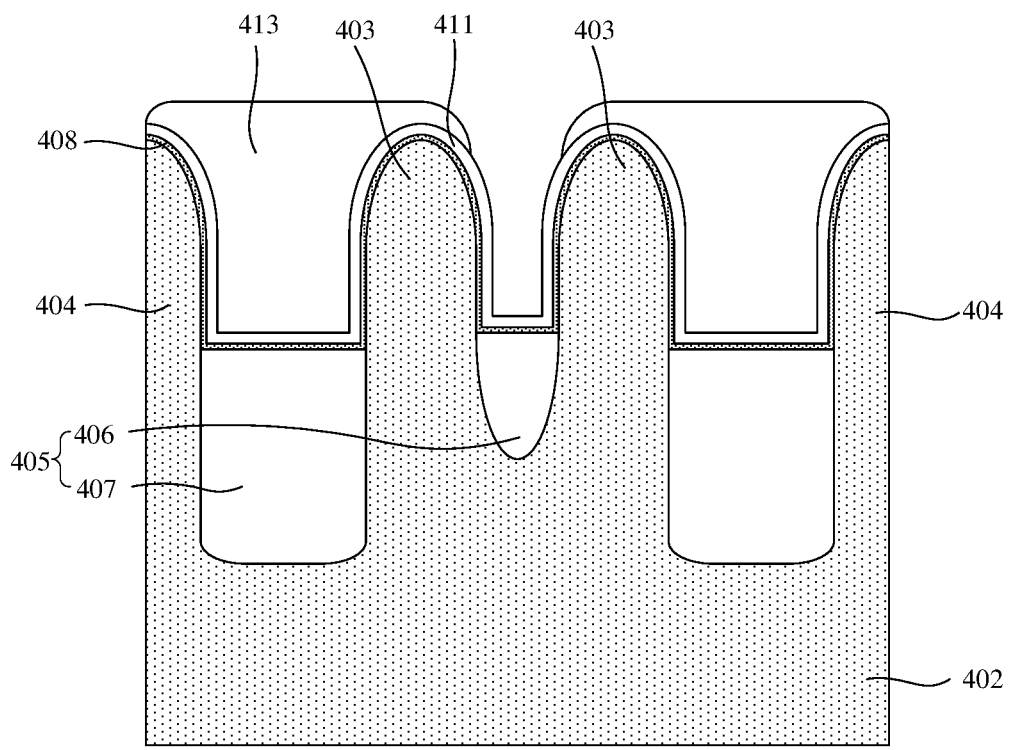

Referring to FIG. 12, the sacrificial layer 413 in an area where the first fins 403 are opposite is removed.

Figure 13:
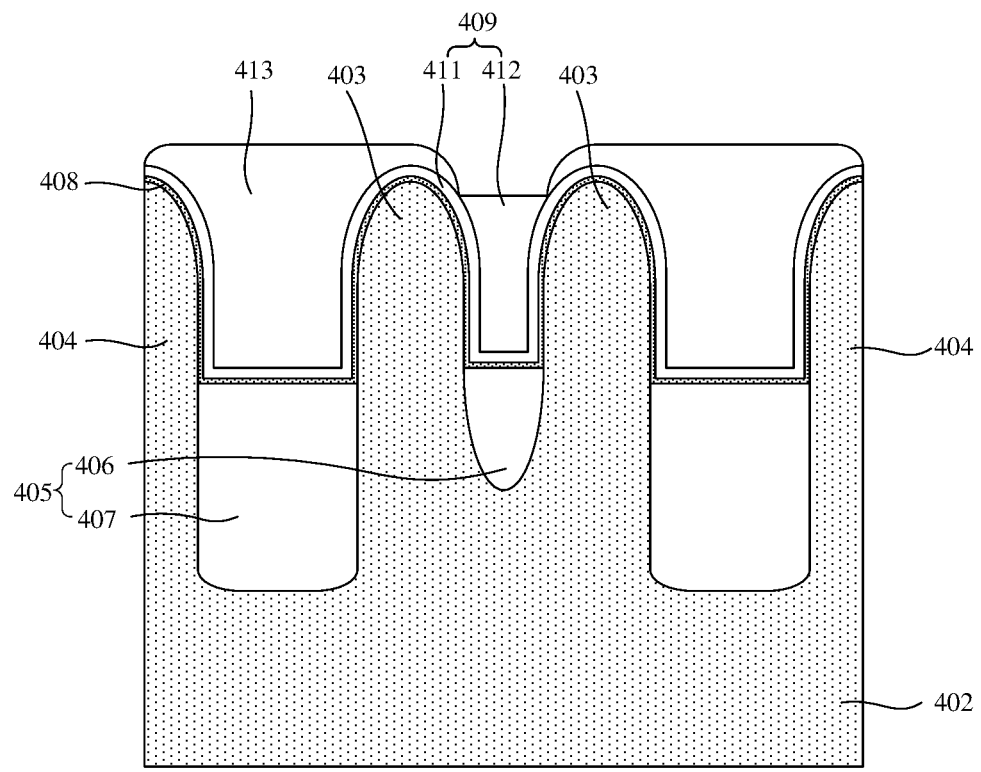

Referring to FIG. 13, a second work function layer 412 is formed on the surface of the first work function layer 411 in the area where the adjacent first fins 403 are opposite. In the embodiment, the area where the two first fins 403 are opposite is filled up with the second work function layer 412. That is, the second work function layer 412 is of an integrated structure, instead of two separated work function layers covering the different first fins 403, there being no gap in the second work function layer 412. In addition, filling the area where the two first fins 403 are opposite further means that the thickness of the second work function layer 412 in a direction perpendicular to a surface of the substrate 402 is greater than preset requirements, for example, height difference between a top surface of the second work function layer 412 and top surfaces of the first fins 403 is smaller than preset height difference. In other embodiments, the area where the two first fins 403 are opposite may not be filled up with the second work function layer 412.

Figure 14:
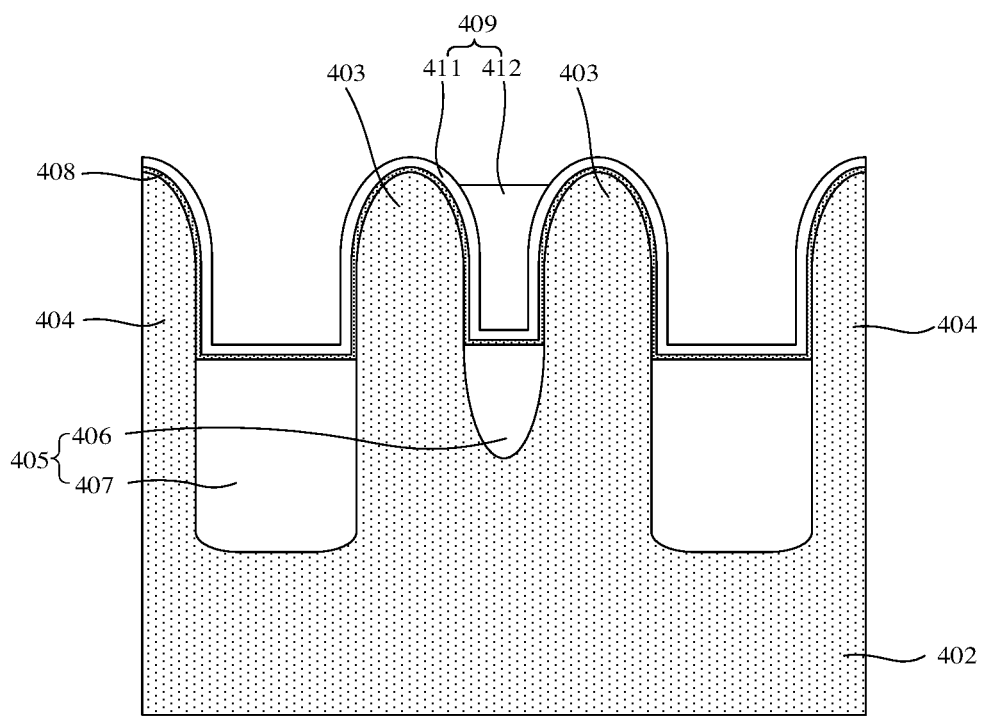

Referring to FIG. 14, the sacrificial layer 413 in an area where the first fin 403 is opposite to the (adjacent) second fin 404 is removed (Referring to FIG. 13).

Figure 15:
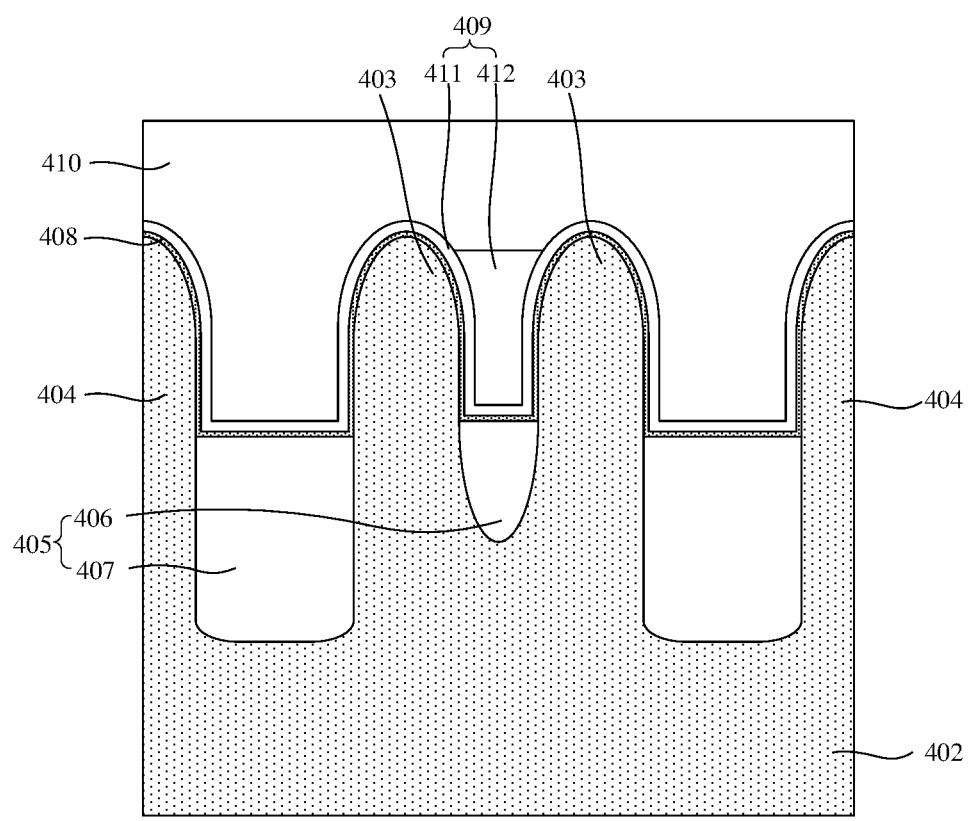

Referring to FIG. 15, a conductive layer 410 is formed on surfaces of the work function layers 409.

In summary, by adjusting the process step of manufacturing the work function layers 409, the first work function layer 411 and the second work function layer 412 are formed on the side walls where the adjacent first fins 403 are opposite; the total thickness of the first work function layer 411 and the second work function layer 412 is greater than the thickness of the first work function layer 411 on the side wall where the first fin 403 faces towards the second fin 404, so that the threshold voltage in the area where the adjacent first fins 403 are opposite is greater than the threshold voltage in the area where the first fin 403 faces towards the second fin 404. As a result, fewer electrons are diffused in the channel region between the adjacent first fins 403, signal interference is small, and stability of the memory is good.

It should be understood by those of ordinary skill in the art that the implementation manners are specific embodiments of the present disclosure, and various changes can be made in forms and details in practical application, without departing from the spirit and scope of the present disclosure. Modifications and changes may be made by anyone skilled in the art without departing from the spirit and scope of the present disclosure, and therefore, the protection scope of the present disclosure is subject to the protection scope in claims.

The invention claimed is:

1. A memory, comprising:
a substrate, on which first fins and second fins are separately disposed, wherein at least two first fins are disposed between adjacent second fins, a spacing between the adjacent first fins is smaller than a spacing between the first fin and the second fin; a surface of the substrate is provided with an isolating structure comprising a first isolating structure and a second isolating structure, the first isolating structure is disposed between the adjacent first fins, and the second isolating structure is disposed between the first fin and the second fin; a dielectric layer covers tops of the first fins, side wall surfaces exposed by the isolating structure, tops of the second fins and side wall surfaces exposed by the second isolating structure;

work function layers disposed on a surface of the dielectric layer, wherein in a direction parallel to an arrangement direction of the first fins and the second fins, the work function layers on side walls where the at least two first fins are opposite are provided with a first thickness, the work function layers on side walls where the first fins face towards the second fins are provided with a second thickness, and the first thickness is greater than the second thickness; and a conductive layer disposed on surfaces of the work function layers.

2. The memory of claim 1, wherein in a direction where the substrate points to the first fins, the dielectric layer and the first isolating structure are enclosed into a first filling region in an area where the adjacent first fins are opposite, and the first filling region is filled up with the work function layers.

3. The memory of claim 1, wherein a gap is formed between the work function layers on the side walls where the at least two first fins are opposite.

4. The memory of claim 1, wherein the work function layers comprise a first work function layer covering a whole surface of the dielectric layer and a second work function layer which is disposed on the first work function layer on the side walls where the at least two first fins are opposite.

5. The memory of claim 4, wherein materials of the first work function layer are identical with materials of the second work function layer.

6. The memory of claim 1, wherein the first thickness is in a range of around 5 nm to around 50 nm, and the second thickness is in a range of around 2 nm to around 30 nm.

7. The memory of claim 1, wherein a difference between the first thickness and the second thickness is in a range of around 3 nm to around 30 nm.

8. The memory of claim 1, wherein work functions of the work function layers are greater than a work function of the conductive layer.

9. The memory of claim 8, wherein materials of the work function layers include titanium nitride, cobalt or nickel.

10. The memory of claim 2, wherein the first filling region is in a range of around 8 nm to around 50 nm in width.

11. A manufacturing method of a memory, comprising:
providing a substrate, on which first fins and second fins are separately disposed, wherein at least two first fins are disposed between adjacent second fins, a spacing between the adjacent first fins is smaller than a spacing between the first fin and the second fin; a surface of the substrate is provided with an isolating structure comprising a first isolating structure and a second isolating structure, the first isolating structure is disposed between the adjacent first fins, and the second isolating structure is disposed between the first fin and the second fin;

forming a dielectric layer on tops of the first fins, side wall surfaces exposed by the isolating structure, tops of the second fins and side wall surfaces exposed by the second isolating structure;

forming work function layers on a surface of the dielectric layer, wherein in a direction parallel to an arrangement direction of the first fins and the second fins, the work function layers on side walls where the at least two first fins are opposite are provided with a first thickness, the work function layers on side walls where the first fins face towards the second fins are provided with a second thickness, and the first thickness is greater than the second thickness; and forming a conductive layer on surfaces of the work function layers.

12. The manufacturing method of the memory of claim 11, wherein in a direction where the substrate points to the first fins, the dielectric layer and the first isolating structure are enclosed into a first filling region in an area where the adjacent first fins are opposite;

wherein the forming the work function layers comprise:
forming the work function layers on a whole surface of the dielectric layer until the first filling region is filled up.

13. The manufacturing method of the memory of claim 11, wherein the forming the work function layers comprises:

forming a first work function layer on a whole surface of the dielectric layer; and forming a second work function layer which is disposed on the first work function layer on the side walls where the at least two first fins are opposite.

14. The manufacturing method of the memory of claim 13, wherein the forming the second work function layer comprises:

forming a sacrificial layer on a surface of the first work function layer;

removing the sacrificial layer in an area where the adjacent first fins are opposite;

forming the second work function layer on the surface of the first work function layer in the area where the adjacent first fins are opposite; and removing the sacrificial layer in an area where the first fin is opposite to the second fin.

15. The manufacturing method of the memory of claim 11, further comprising:

forming a gap between the work function layers on the side walls where the at least two first fins are opposite.

16. The manufacturing method of the memory of claim 13, wherein materials of the first work function layer are identical with materials of the second work function layer.

17. The manufacturing method of the memory of claim 11, wherein the first thickness is in a range of around 5 nm to around 50 nm, and the second thickness is in a range of around 2 nm to around 30 nm.

18. The manufacturing method of the memory of claim 11, wherein a difference between the first thickness and the second thickness is in a range of around 3 nm to around 30 nm.

19. The manufacturing method of the memory of claim 11, wherein work functions of the work function layers are greater than a work function of the conductive layer.

20. The manufacturing method of the memory of claim 19, wherein materials of the work function layers include titanium nitride, cobalt or nickel.

* * * * *